Nov. 1, 1960 B. W. LEE 2,958,789

TRANSISTOR CIRCUIT

Filed April 23, 1957

INVENTOR
B. W. LEE
BY
Harold C. Herman
ATTORNEY

United States Patent Office 2,958,789

Patented Nov. 1, 1960

2,958,789

TRANSISTOR CIRCUIT

Bock W. Lee, New York, N.Y., assignor to Bell Telephone Laboratories, Incorporated, New York, N.Y., a corporation of New York Filed Apr. 23, 1957, Ser. No. 654,604

8 Claims. (Cl. 307—88.5)

This invention relates to semiconductor signal translating devices and more particularly to bistable circuits including transistors.

A bistable circuit is one which has two equilibrium conditions and can be rapidly shifted, displaced, or triggered from one condition to the other. Devices such as transistors which have a current amplification factor greater than one lend themselves to bistable circuit applications. The current amplification factor, or alpha, of a transistor is the ratio of its collector current to its emitter current. By connecting a relatively large impedance to the base electrode of a transistor which has a current amplification factor greater than one, an input transistor characteristic having a negative resistance region is obtained. Such circuits which have a transistor and a base impedance are disclosed, for example, in Patent 2,629,833 granted to R. L. Trent on February 24, 1953.

Two recognized classes of transistors are the point contact transistor, of which those disclosed in Patent 2,524,035 granted October 3, 1950 to J. Bardeen and W. H. Brattain are illustrative, and the junction transistor, of which those disclosed in Patent 2,569,347 granted September 25, 1951 to W. Shockley, are illustrative. Point contact transistors have a current amplification factor greater than one and junction transistors have a current amplification factor less than one.

Transistors of both kinds are also classified as to conductivity type with the NPN junction transistor, for example, being of opposite conductivity type as the PNP junction transistors of opposite conductivity type may be interconnected to form a combined transistor device which has a current amplification factor greater than one and which can be utilized instead of the point contact transistor in bistable circuit applications. Such combined transistor devices are disclosed, for example, in the Patent 2,655,609 granted to W. Shockley on October 13, 1953.

A general object of this invention is to provide an improved combined translating device having a current amplification factor greater than one so that, together with a base impedance, it may be utilized as a negative resistance element in a bistable circuit.

Another general object of this invention is to obtain novel and improved performance characteristics for circuit elements including transistors.

More specific objects of this invention are to realize relatively high but controlled current amplification factors and also relatively small leakage currents and dissipation for combined translating devices which include junction transistors.

Another specific object of this invention is to provide a combined translating device which has an adjustable current amplification factor.

In accordance with one illustrative embodiment of this invention a pair of junction transistors of opposite conductivity type are interconnected with the base of each connected to the collector of the other. The interconnected junction transistors together with two impedances are connected as a three-terminal combined device. One terminal is connected to the emitter of one of the transistors, another terminal is connected to the base of the same transistor and the two impedances connect, respectively, the base and emitter of the other transistor to the third terminal. The three-terminal device, which includes the two impedances, functions to provide a current amplification factor greater than one.

A feature of this invention relates to the provision of two impedances connected as part of the combined device. The two impedances function to control the composite alpha and reduce leakage currents so that the size of the alpha of the junction transistors utilized in the device is not restricted thereby.

Another feature of this invention relates to means for readily adjusting the composite alpha of the combined transistor device.

A further feature of this invention pertains to the utilization of the combined device as the negative resistance element in a bistable circuit.

Still a further feature of this invention relates to means in the combined device for decreasing the turn-on interval of the bistable circuit. The impedance connected from the output terminal of the combined device to the base electrode of one of the junction transistors includes an inductor which functions to increase the composite current amplification factor of the device during the turn-on interval. The large transient current amplification results in a relatively short turn-on interval.

Still a further feature of this invention relates to means for reducing the current amplification factor during the turn-off interval. The inductor functions to maintain the shunt current to effectively reduce the current amplification factor during the turn-off interval.

Further objects and features will become apparent upon consideration of the following description read in conjunction with the drawing wherein.

Figure 1:
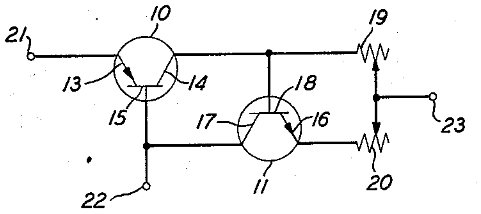
Fig. 1 is a circuit representation of the combined transistor device of this invention.

Referring now to the drawing, the three-terminal transistor device illustrated in Fig. 1 comprises a pair of junction transistors 10 and 11 of opposite conductivity type. The transistor 10 is a PNP junction transistor having an emitter 13, a collector 14 and a base 15, and the transistor 11 is an NPN junction transistor having an emitter 16, a collector 17 and a base 18. The two transistors 10 and 11, which advantageously have substantially similar performance characteristics except, of course, for the difference in polarities, are connected between three terminals 21, 22 and 23. The emitter 13 and base 15 of transistor 10 are connected respectively to terminals 21 and 22, and the emitter 16 and base 18 are connected respectively through the rheostats 20 and 19 to the terminal 23.

Figure 3:
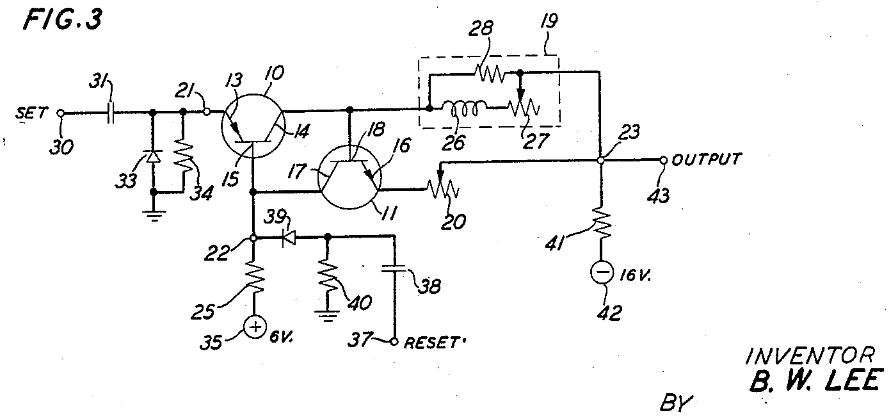
Fig. 3 is a circuit representation of the bistable transistor circuit of this invention.

The terminals 21, 22 and 23 function, respectively, as the emitter, base and collector of the combined transistor device or "hook" connection shown in Fig. 1. Illustrative external circuit connections to the terminals 21, 22 and 23, which are shown in Fig. 3, are hereinafter described. The composite current amplification factor, or ratio, of the device collector current (the current through terminal 23), to the device emitter current (the current through terminal 21), is greater than one even though the inherent current amplification factors of the junction transistors 10 and 11 are less than one. The composite current amplification factor of the combined device shown in Fig. 1 is controlled by the rheostats 19 and 20. If the rheostat 19 is adjusted to present an infinite resistance, or open circuit, and the rheostat 20 is adjusted to present a zero resistance, or short circuit, the emitter 16 of the NPN transistor 11 becomes functionally the collector of the combined device. With the rheostats 19 and 20 so adjusted, they are functionally not present in the combined device. When the rheostats 19 and 20 are so adjusted, the combined device constitutes an equivalent transistor having a composite current amplification factor, alpha, given by the relation $$\text{alpha} = \frac{\text{alpha (10)}}{1 - \text{alpha (11)}}$$

where alpha (10) is the current amplification factor of transistor 10 and alpha (11) is the current amplification factor of transistor 11. It is evident that the composite alpha is much greater than either alpha (10) or alpha (11). For example, if both alpha (10) and alpha (11) are equal to 0.9, the composite alpha is equal to 9. The composite alpha becomes larger as the alpha of transistor 11 approaches 1.

With the rheostats 19 and 20 effectively out of the circuit in the manner described above, the total leakage current of the combined device is given by the relation $$\text{total leakage current} = \frac{Ico\ (10) + Ico\ (11)}{1 - \text{alpha (11)}}$$

where $Ico$ (10) and $Ico$ (11) are, respectively, the leakage currents of the transistors 10 and 11. It is evident, therefore, that the total leakage current would be exceedingly high if the current amplification factor, or alpha, of the transistor 11 approaches 1.

The two characteristics, composite alpha and total leakage current, place limitations on the current amplification factor of transistor 11 when the rheostats 19 and 20 are adjusted in the manner described above to present, respectively, infinite and zero impedances. For bistable circuit applications, the composite alpha should be between 1.6 and 4 and the total leakage current should be less than 1 milliampere. If the composite alpha is much less than 1.6 a bistable circuit, including the combined device, cannot be readily triggered from one condition to the other, and in fact ceases to be a bistable circuit. If the composite current amplification factor is greater than 4 the reset current required to trigger the bistable circuit from its high current condition to its low current condition is almost as large as the load current. For example, the required reset current for a bistable circuit utilizing a combined device having a composite current amplification factor of nine is $\frac{8}{9}$ of the total collector current.

Moreover, if the total leakage current exceeds 1 milliampere, the dissipation in the transistors 10 and 11 and associated circuit components shown in Fig. 3 is, of course, relatively large, and bistability may be impossible. Bistability becomes impossible with large leakage currents coupled with the large composite alpha because the bistable circuit automatically triggers or shifts to a high current condition. The large leakage automatically restores the circuit to a high current condition after the termination of a reset pulse.

For these reasons, when the rheostats 19 and 20 are not included in the combined device, the current amplification factor of the transistor 11 must be restricted to a value less than 0.75. The rheostats 19 and 20 function to adjust the composite current amplification factor and to reduce both the total leakage current and the required reset current so that the magnitudes of the current amplification factors of the transistors 10 and 11 are not restricted.

The rheostat 19 functions to shunt part of the collector current of transistor 10 around the transistor 11. More specifically the collector current of transistor 10 is provided to a two-branch parallel circuit arrangement, with one branch consisting of the base-to-emitter junction of transistor 11 in series with the rheostat 20 and the other branch consisting of the rheostat 19. The portion of the collector current of transistor 10 that passes through the rheostat 19 is not amplified by the transistor 11. Moreover, a part of the collector current of transistor 11 is shunted through the rheostat 19 instead of being amplified to the emitter 16 of transistor 11. A portion of both the collector current of transistor 10 and the collector current of transistor 11 is, in this manner, shunted from amplification through the transistor 11. The amount of these shunted currents is controlled by the magnitude of the resistance presented by the rheostat 19. The smaller the resistance presented by the rheostat 19 the greater are the shunted currents and the smaller is the composite current amplification factor of the combined device.

This shunting arrangement not only reduces the current amplification factor of the combined device but it also effectively controls the total leakage current of the combined device. A portion of both the leakage current of transistor 10 and of transistor 11 is shunted through the rheostat 19 to the terminal 23 instead of being amplified through the transistor 11 to the terminal 23. When the combined device is in a low current condition, the effect of the rheostat 19 on the combined current amplification factor and total leakage current is assisted by the relatively large resistance presented by the emitter junction of transistor 11. In the low current condition the resistance presented by the emitter junction of transistor 11 is high so that a greater percentage of the collector currents of transistors 10 and 11 are shunted through the rheostat 19. When, however, the combined device is in a high current condition the emitter junction of transistor 11 presents a very low impedance so that a smaller percentage of the collector currents of transistors 10 and 11 are shunted through the rheostat 19. In this manner, the current amplification factor of the combined device is small when the combined device is in a low current condition and it is higher when the combined device is in a high current condition. The high impedance of the emitter junction at low current levels makes the composite current amplification factor of the combined device very nearly equal to the current amplification factor of the PNP transistor 10.

Since the impedance of the emitter junction of transistor 11 is very small at high current levels, the rheostat 19 is shunted by a very small impedance if the rheostat 20 is set to present a short-circuit connection from the emitter 16 to the terminal 23. As described above, it is not only necessary to restrict the magnitude of the composite current amplification factor at low current levels because of the leakage current effects but also at high current levels to restrict the required magnitude of reset currents. The rheostat 20 functions to fix the maximum value of the composite current amplification factor at high current levels. The rheostat 20 fixes the maximum current amplification factor because it introduces an impedance in the emitter circuit of transistor 11 which parallels the path through the rheostat 19. Some of the collector currents of the transistors 10 and 11 are therefore shunted through the rheostat 19 at high current levels as well as at low current levels. Even with rheostat 20, the percentage of collector currents that is shunted through the rheostat 19 at high current levels is smaller than that shunted through the rheostat 19 at low current levels because of the change in impedance of the emitter junction of transistor 11.

The rheostat 20, in addition to fixing the maximum of the composite current amplification factor at high current levels, also assists in reducing leakage currents. The added impedance in the emitter circuit of transistor 11 causes a larger percentage of the collector currents of transistors 10 and 11 to pass through the rheostat 19. At relatively high temperatures the impedance presented by the emitter junctions of transistors 10 and 11 is reduced. The rheostat 20 therefore forms an important function in maintaining reduced leakage currents at relatively high ambient temperatures.

The over-all power dissipation of the combined device is very small because of the small currents passing through the high resistance base circuits of transistors 10 and 11. When the rheostats 19 and 20 are included in the combined device, the dissipation is lower for the low current levels, for the high current levels and also during transients. The dissipation is lower because some of the current which would normally pass through the base 15 or the base 18 is shunted through the rheostat 19.

Figure 2:
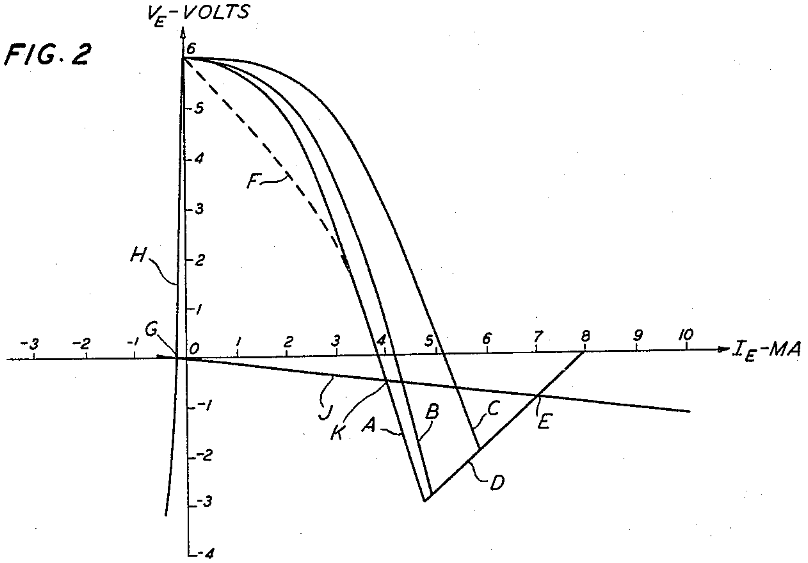
Fig. 2 is a series of curves illustrating the operation of combined transistor devices of this invention.

The combined device shown in Fig. 1 may be utilized in a bistable circuit shown in Fig. 3. The terminals 21, 22 and 23 designated in Fig. 3 are similar to the terminals 21, 22 and 23 in Fig. 1. The combined device shown in Fig. 3 between the terminals 21, 22 and 23 is a modification of the combined device disclosed above and shown in Fig. 1. When the combined device shown in Fig. 1 is utilized in the bistable circuit shown in Fig. 3 it provides for a negative resistance characteristic of the type shown in Fig. 2.

The negative characteristic has a low current positive resistance region H, a negative resistance region A, and a high current positive resistance region D. Curves B and C illustrate the variations of the negative resistance region due to adjusting the rheostats 19 and 20. The bistable circuit shown in Fig. 3 has two equilibrium conditions: one at point G in the low current positive resistance region H; and one at point E in the high current positive resistance region. The points G and E are on the emitter load line J which intersects the negative resistance characteristic at points G, K and E. The negative resistance characteristics differ from the ordinary negative resistance characteristic provided by a transistor device because the low emitter current portion of the region A is relatively horizontal. The negative resistance region A is relatively horizontal for low emitter currents because the combined device has a very low current amplification factor, as described above, at low current levels. The effect of the low current amplification factor at low current levels, or of the horizontal portion of the characteristic, is a degradation of turn-on sensitivity. As is hereinafter described, the utilizing of an inductive impedance arrangement instead of the rheostat 19 as the shunting path for the collector currents of the transistors 10 and 11 compensates for the degradation of turn-on sensitivity, and provides for a negative resistance region shown by the dotted curve F and a portion of region A.

The combined device shown in Fig. 3 is similar to the device shown in Fig. 1 except that the designation 19 refers to an adjustable circuit arrangement instead of a rheostat. The base electrode 18 of transistor 11 is connected through the inductor 26 and the resistor 27 to the terminal 23, and the serially connected inductor 26 and resistor 27 are shunted by the resistor 28. The inductor 26 improves the turn-on sensitivity by making the composite amplification factor relatively high during the turn-on transient. During the transient, the inductor 26 presents a high impedance so that a much higher percentage of the collector currents of transistors 10 and 11 are amplified through the transistor 11, and a smaller input current is required to trigger the bistable circuit. When the transient terminates, the inductor 26 again presents a low impedance to allow a larger percentage of the collector currents to be shunted away from the transistor 11. In this manner the inductor 26 functions to increase the composite alpha of the device during the triggering transient, and reduces the turn-on interval. It is important to have the current amplification factor of the combined device relatively high during the triggering transient to reduce the interval for switching the combined device from one current condition to another. The resistor 28 serves the dual purpose of dissipating the transients set up in the inductor 26 and of limiting the transient composite current amplification factor from being excessive. This latter function is necessary to protect the bistable circuit from being so sensitive as to be effected by inductive pick-ups.

The inductor 26 does not effect the current amplification factor during steady state conditions. The effective current amplification factor for leakage currents is therefore maintained at a low level.

The bistable circuit shown in Fig. 3 is set by an input pulse which is provided through the input terminal 30 and the coupling capacitor 31 to the terminal 21 of the combined device. The terminal 21 is connected to ground through the varistor 33 shunted by the resistor 34. The varistor 33 functions to shunt negative pulses through the terminal 30 to ground and the resistor 34 functions as part of a biasing circuit arrangement for the combined device. The biasing arrangement includes the plus 6-volt potential source 35 which is connected through the base resistor 25 to terminal 22 of the combined device. The emitter 13 of transistor 10 is normally reverse biased with respect to the base 15 of transistor 10 by 6 volts due to the biasing arrangement. The input pulse therefore must be greater than 6 volts to overcome this bias and trigger the bistable circuit from its low current condition to its high current condition.

Reset pulses are provided to the bistable circuit through the terminal 37, the coupling capacitor 38 and the varistor 39 to the terminal 22 of the combined device. The varistor 39 is reverse biased when the circuit is at its low current equilibrium condition due to its connection through the resistor 40 to ground on one side and through the resistor 25 to the plus 6-volt potential source 35 on the other side.

The inductor 26 functions to reduce the composite current amplification factor during the turn-off trigger interval by maintaining the shunt current through the adjustable arrangement 19. The inductor 26 in this manner performs a dual function as it increases the current amplification factor during the turn-on interval and it decreases the current amplification factor during the turn-off interval. The reduction of the current amplification factor during the turn-off interval permits the utilization of smaller reset currents to reset the bistable circuit.

An illustrative embodiment of this invention includes the following circuit parameters:

| | |
|---|---|
| Transistor **10** | W.E. 1868, alpha=.99. |
| Transistor **11** | W.E. 1853, alpha=.99. |
| Rheostat **20** | Set at 20 ohms. |
| Resistor **25** | 3000 ohms. |
| Inductor **26** | 300 microhenries. |
| Rheostat **27** | Set at 60 ohms. |
| Resistor **28** | 500 ohms. |
| Capacitor **31** | .01 microfarad. |
| Resistor **34** | 51,000 ohms. |
| Battery **35** | plus 6 volts. |
| Capacitor **38** | .05 microfarad. |
| Resistor **40** | 10,000 ohms. |
| Resistor **41** | 1600 ohms. |
| Battery **42** | minus 16 volts. |

For the above circuit parameters, the combined device has approximate current amplification factors of 1.03, 3 and 10, respectively, at low current condition, high current condition and transient condition of the bistable circuit. With the rheostats 19 and 20 set as indicated above, the dissipation in the transistors 10 and 11 is approximately one-fourth of the dissipation in transistors 10 and 11 when the rheostats 19 and 20 are not included in the circuit. In other words, the rheostats 19 and 20 function to materially reduce the dissipation in the transistors 10 and 11.

The present invention is, of course, not restricted to the above circuit parameters or particular circuit configuration as it is to be understood that the above-described arrangements are merely illustrative of the application of the principles of this invention. Numerous other arrangements may be devised by those skilled in the art without departing from the spirit and scope of the invention.

What is claimed is:

1. A signal translating device comprising a pair of transistors of opposite conductivity types, each of said transistors having a base, an emitter and a collector, said base of each of said transistors being directly connected to said collector of the other of said transistors, a pair of terminals connected respectively to said base and said emitter of one of said transistors, another terminal, means connected to said another terminal for adjusting the current amplification factor of said device at low current levels, and means connected to said another terminal for adjusting the current amplification factor of said device at high current levels, at least one of said means including a reactive element.

2. A bistable circuit comprising a pair of transistors of opposite conductivity types, each of said transistors having a base, an emitter and a collector, means connecting said base of each of said transistors to said collector of the other of said transistors, a feedback promoting resistor connected to said base electrode of one of said transistors, a biasing arrangement for said emitter and said base of said one transistor, an inductive circuit arrangement connected to said base of the other one of said transistors, biasing means connected to said inductive circuit arrangement and to said emitter of the other one of said transistors, an input terminal connected to said emitter of said one transistor, and an output terminal connected to said inductive circuit arrangement.

3. A bistable circuit in accordance with claim 2 comprising in addition an impedance element connected between said emitter of said other transistor and said output terminal.

4. A bistable circuit in accordance with claim 3 wherein both said inductive circuit arrangement and said impedance element are adjustable.

5. A bistable circuit in accordance with claim 4 wherein said inductive circuit arrangement includes an inductor, an adjustable resistor serially connected with said inductor between said output terminal and said base of said other transistor, and a shunting resistor connected across said serially connected inductor and adjustable resistor.

6. A signal translating device comprising a PNP junction transistor, an NPN junction transistor, each of said transistors having a base, an emitter and a collector, means connecting said base of each of said transistors to said collector of the other one of said transistors, a first connection to said base of said PNP transistor, a second connection to said emitter of said PNP transistor, a third connection, an impedance connected between said third connection and said base of said NPN transistor for reducing the leakage currents through said NPN transistor, an impedance connected between said third connection and said emitter of said NPN transistor for reducing the current amplification factor of said device at high current levels, said impedance connected to said base of said NPN transistor including a serially connected inductor and resistor, and a resistor shunting said serially connected inductor and resistor.

7. A signal translating device comprising a pair of junction transistors of opposite conductivity types, each of said transistors having a base, an emitter and a collector, said base of each of said transistors being directly connected to said collector of the other of said transistors, a first connection to said emitter of one of said transistors, a second connection to said base of said one of said transistors, a third connection, a first impedance connected between said third connection and said base of the other of said transistors, and a second impedance connected between said third connection and said emitter of the other of said transistors, said first impedance including an inductance.

8. A signal translating device comprising a pair of junction transistors of opposite conductivity types, each of said transistors having a base, an emitter and a collector, the base of each of said transistors being directly connected to the collector of the other of said transistors, a first connection to the emitter of one of said transistors, a second connection to the base of said one of said transistors, a third connection, first impedance means connected between said third connection and the base of the other of said transistors for controlling the current amplification factor of said device at low current levels, and means connected between said third connection and the emitter of said other of said transistors, said last-mentioned means comprising second impedance means for controlling the current amplification factor of said device at high current levels.

References Cited in the file of this patent

UNITED STATES PATENTS

| | | |
|---|---|---|
| 2,655,610 | Ebers | Oct. 13, 1953 |
| 2,744,198 | Raisbeck | May 1, 1956 |
| 2,770,732 | Chong | Nov. 13, 1956 |
| 2,829,257 | Root | Apr. 1, 1958 |
| 2,838,617 | Tummers | June 10, 1958 |
| 2,840,727 | Guggi | June 24, 1958 |
| 2,864,062 | Schaffner | Dec. 8, 1959 |
| 2,874,232 | Jochems | Feb. 17, 1959 |
| 2,890,353 | Van Overbeek | June 9, 1959 |
| 2,904,758 | Miranda | Sept. 15, 1959 |

OTHER REFERENCES

"Transistor and Junction Diodes in Telephone Power Plants," Bell System Technical Journal, July 1954, pages 845, 846.